United States Patent
Tokuno et al.

(10) Patent No.: US 12,516,279 B2
(45) Date of Patent: Jan. 6, 2026

(54) CELL SHEET-FORMING MEMBER, METHOD FOR PRODUCING CELL SHEET-FORMING MEMBER, AND METHOD FOR PRODUCING CELL SHEET

(71) Applicant: Oji Holdings Corporation, Chuo-ku (JP)

(72) Inventors: Hisako Tokuno, Tokyo (JP); Koki Hongo, Tokyo (JP); Kei Shinotsuka, Tokyo (JP)

(73) Assignee: Oji Holdings Corporation, Tokyo (JP)

( * ) Notice: Subject to any disclaimer, the term of this patent is extended or adjusted under 35 U.S.C. 154(b) by 1113 days.

(21) Appl. No.: 16/640,247

(22) PCT Filed: Aug. 22, 2018

(86) PCT No.: PCT/JP2018/030896
§ 371 (c)(1),
(2) Date: Jan. 8, 2021

(87) PCT Pub. No.: WO2019/039485
PCT Pub. Date: Feb. 28, 2019

(65) Prior Publication Data
US 2021/0130762 A1    May 6, 2021

(30) Foreign Application Priority Data

Aug. 23, 2017 (JP) .................................. 2017-160545
Feb. 9, 2018 (JP) .................................. 2018-021993

(51) Int. Cl.
*C12M 1/22* (2006.01)
*C12M 1/12* (2006.01)

(52) U.S. Cl.
CPC ............ *C12M 25/06* (2013.01); *C12M 23/10* (2013.01)

(58) Field of Classification Search
None
See application file for complete search history.

(56) References Cited

U.S. PATENT DOCUMENTS

| | | | | |
|---|---|---|---|---|
| 2004/0125266 A1* | 7/2004 | Miyauchi | ............... | G02B 1/118 349/57 |
| 2005/0214935 A1* | 9/2005 | Kuwabara | .............. | C12M 23/10 435/299.1 |

(Continued)

FOREIGN PATENT DOCUMENTS

| | | |
|---|---|---|
| EP | 2447354 | 5/2012 |
| JP | 2005168494 | * 6/2005 |

(Continued)

OTHER PUBLICATIONS

Petronis "Model porous surfaces for systematic studies of material-cell interactions" (2003) (Year: 2003).*

(Continued)

*Primary Examiner* — Michael A Marcheschi
*Assistant Examiner* — Nathan G Esperon
(74) *Attorney, Agent, or Firm* — Schwegman Lundberg & Woessner, P.A.

(57) ABSTRACT

A cell sheet-forming member provided with a surface for forming a cell sheet, wherein the surface comprises a plurality of flat parts and a plurality of concavo-convex parts. Each flat part has a shape extending along a first direction and the plurality of the flat parts are aligned along a second direction intersecting with the first direction over the entire surface. Either of convex parts or concave parts have a stepped structure and individual concave and convex parts include a plurality of the stepped structures which fill gaps between flat parts adjacent to each other, wherein the pitch of said stepped structures is from 100 nm to 10 μm inclusive.

20 Claims, 6 Drawing Sheets

(56) References Cited

U.S. PATENT DOCUMENTS

| | | | | |
|---|---|---|---|---|
| 2008/0009063 | A1* | 1/2008 | Okano | C12M 25/06 435/402 |
| 2008/0057578 | A1 | 3/2008 | Kuwabara et al. | |
| 2009/0170190 | A1* | 7/2009 | Nishi | C12M 25/00 427/272 |
| 2010/0129908 | A1 | 5/2010 | Fang et al. | |
| 2012/0100612 | A1 | 4/2012 | Takahashi et al. | |
| 2012/0141547 | A1* | 6/2012 | Zhao | A61L 27/3895 435/402 |
| 2013/0244889 | A1* | 9/2013 | Yim | G03F 7/0002 435/375 |

FOREIGN PATENT DOCUMENTS

| | | | |
|---|---|---|---|
| JP | 2005312343 | * | 11/2005 |
| JP | 2006-191809 A | | 7/2006 |
| JP | 2010063429 | | 3/2010 |
| WO | 2007049576 | | 5/2007 |
| WO | WO-2007/049576 A1 | | 5/2007 |
| WO | 2007105418 | | 9/2007 |
| WO | WO-2007/105418 A1 | | 9/2007 |
| WO | 2010059583 | | 5/2010 |
| WO | 2014072432 | | 5/2014 |

OTHER PUBLICATIONS

Petronis "Microfabricated force-sensitive elastic substrates for investigation of mechanical cell-substrate interactions" J. Micromech. Microeng. (2003) (Year: 2003).*
Tanaka "Demonstration of a PDMS-based bio-microactuator using cultured cardiomyocytes to drive polymer micropillars" Lab-on-a-Chip (2005). (Year: 2005).*
Chen. "Water Adsorption on Hydrophilic and Hydrophobic Surfaces of Silicon". : J. Phys. Chem. C 2018, 122, 11385-11391 (Year: 2018).*
Verdaguer ("Growth and Structure of Water on SiO2 Films on Si Investigated by Kelvin Probe Microscopy and in Situ X-ray Spectroscopies"). 2007. (Year: 2007).*
Ricci ("Scaling-Up Techniques for the Nanofabrication of Cell Culture Substrates via Two-Photon Polymerization for Industrial-Scale Expansion of Stem Cells"). Jan. 13, 2017. (Year: 2017).*
"European Application Serial No. 18848910.8, Extended European Search Report mailed Apr. 19, 2021", 7 pgs.
"Chinese Application Serial No. 201880053662.1, Office Action mailed Feb. 19, 2023", w/ English Translation, 14 pgs.
"International Application Serial No. PCT/JP2018/030896, International Search Report mailed Nov. 20, 2018", w/ English Translation, 4 pgs.
"International Application Serial No. PCT/JP2018/030896, International Preliminary Report on Patentability mailed Jul. 22, 2019", w/ English Translation, 13 pgs.
Khan, Saida, "A comprehensive review of surface modification for neural cell adhesion and patterning", Journal of Biomedical Materials Research Part A, vol. 93A, (2010), 1209-1224.
Tymchenko, N., "A Novel Cell Force Sensor for Quantification of Traction during Cell Spreading and Contact Guidance", Biophysical Journal, 93(1), (2007), 335-345.

* cited by examiner

CELL SHEET-FORMING MEMBER, METHOD FOR PRODUCING CELL SHEET-FORMING MEMBER, AND METHOD FOR PRODUCING CELL SHEET

CROSS-REFERENCE TO RELATED APPLICATIONS

This application is a U.S. National Stage Filing under 35 U.S.C. 371 from International Application No. PCT/JP2018/030896, filed on Aug. 22, 2018, and published as WO 2019/039485 A1 on Feb. 28, 2019, which claims the benefit of priority to Japanese Patent Application No. 2017-160545, filed on Aug. 23, 2017, and to Japanese Patent Application No. 2018-021993, filed on Feb. 9, 2018, each of which is incorporated by reference herein in its entirety.

TECHNICAL FIELD

The present invention relates to a cell sheet-forming member for forming a cell sheet, a method of manufacturing a cell sheet-forming member, and a method of manufacturing a cell sheet.

BACKGROUND ART

Various methods for cell culture have been proposed in the relate art. For example, in a cell culture method described in Patent Document 1, a cell culture substrate provided with a plurality of space structures defined by fine side walls is used to control orientation of a cell by aligning a direction in which the space structures communicate each other and an extension direction of the cell.

CITATION LIST

Patent Literature

Patent Document 1: JP 2006-191809 A

SUMMARY OF INVENTION

Technical Problem

In the cell culture substrate described above, a flat surface such as a side wall surface and a top surface provided in a side wall function as pseudo scaffolding for cell culture. Accordingly, the extension direction of a cell cultured in the cell culture substrate is aligned with the extending direction of the flat surface. On the other land, in addition to the side wall surface and the top surface, a bottom surface of each of the space structures is also a flat surface, and moreover, the bottom surface of the space structure is a surface continuous to the side wall surface, and spreads in a direction different from the extending direction of the side wall surface and the extending direction of the top surface. Thus, in the cell culture substrate described above, the extension direction of a cell is also easily aligned with a direction in which the flat surface is continuous and a direction in which the flat surface spreads, that is, directions other than the extending direction of the side wall surface. Consequently, in view of aligning the extension direction of a cell, a problem still remains.

The present invention has been made in view of the above-described circumstances, and an object of the present invention is to provide a cell sheet-forming member capable of improving orientation of a cell in a cell sheet, a method of manufacturing a cell sheet-firming member, and a method of manufacturing a cell sheet.

Solution to Problem

To solve the above-described problem, a cell sheet-forming member includes a surface for forming a cell sheet, and the surface includes a plurality of flat portions and a plurality of recession/protrusion portions. Each of the plurality of flat portions has a shape extending in a first direction, and the plurality of flat portions are arrayed in a second direction intersecting the first direction over an entirety of the surface. Then, any one of a recession portion and a protrusion portion constitutes a stepped structure, and each of the plurality of recession protrusion portions includes a plurality of the stepped structures filling a gap between the plurality of flat portions adjacent to each other, and a pitch of the plurality of stepped structures is 100 nm or greater and 10 μm or less.

To solve the above-described problem, a method of manufacturing a cell sheet-forming member includes forming a recessed plate, and forming, by transference of the recessed plate, a surface of a cell sheet-forming member for forming a cell sheet. The recessed plate includes a plurality of flat portions each having a shape extending in the first direction, and arrayed in the second direction intersecting the first direction over an entirety of the surface, and a recession/protrusion portion including a recession portion and a protrusion portion any one of which constitutes a stepped structure, and including a plurality of the stepped structures filling a gap between the plurality of flat portions adjacent to each other, the plurality of stepped structures having a pitch of 100 nm or greater and 10 μm or less. Then, the forming a recessed plate includes forming the recession/protrusion portion with use of at least one of a photolithographic method, a colloidal lithographic method, an anodization method, and an interference exposure method.

To solve the above-described problem, a method of manufacturing a cell sheet includes forming a cell sheet in the surface of the cell sheet-forming member by using the cell sheet-forming member to cause a cell to adhere to the surface of the cell sheet-forming member, the cell being more likely to adhere to any one of the plurality of flat portions and the plurality of recession/protrusion portions than to the other, and peeling the cell sheet from the surface of the cell sheet-forming member.

In each of the configurations described above, the flat portions and the recession/protrusion portions constitute the surface for forming a cell sheet, and have a relationship in which one of the flat portions and the recession/protrusion portions is defined by the other. Thus, in any of a case where a cell is more likely to adhere to the flat portions and a case where a cell is more likely to adhere to the recession/protrusion portions, the cell preferentially adheres to one of the structural bodies and is less likely to adhere to the other structural body. Therefore, in combination of the structure of the cell sheet-forming member in which one of the structural bodies define the other structural body with the characteristics of a cell having adhesiveness different between the flat portions and the recession/protrusion portions, the extension direction of a cell is aligned with the first direction being the extending direction of both the structural bodies. As a result, in a cell sheet spreading in a two-dimensional direction, the extension direction of a cell can be aligned with a one-dimensional direction, specifically, orientation of a cell can be improved. Note that, the surface of the cell sheet-forming member includes the flat portions and the recession protrusion portions. Thus, the cell sheet-forming member can be applied in common to both the case of a cell which is more likely to adhere to the flat portions and the case of a cell which is more likely to adhere to the recession/protrusion portions. That is, versatility of the cell sheet-forming member can also be enhanced.

In the cell sheet-forming member, the stepped structure may include the protrusion portion, and the plurality of recession/protrusion portions may include a plurality of the protrusion portions in a bottom surface of a recession portion sandwiched between the plurality of flat portions adjacent to each other. A distal end surface of each of the protrusion portions may be flush with the flat portions. Alternatively, in a thickness direction of the cell sheet-forming member, a difference between a height of a distal end surface of each of the plurality of recession/protrusion portions and a height of each of the plurality of flat portions may be 0.5 µm or less, preferably, 0.3 µm or less. According to this configuration, top surfaces of the recession/protrusion portions are flush with the flat portions, or a difference of elevation between the distal end surfaces of the recession/protrusion portions and the flat portions is 0.5 µm or less, preferably, 0.3 µm or less. Thus, a cell sheet formed to cover the recession/protrusion portions and the flat portions can have enhanced flatness.

In the cell sheet-forming member, the stepped structure may have a circular shape as seen in a direction facing the surface, and the stepped structure may have a diameter of 50% or more and 100% or less of the pitch, and the stepped structure may have an aspect ratio of 0.1 or greater and 10 or less. According to this configuration, higher likeliness of adherence to the flat portions and higher likeliness of adherence to the recession/protrusion portions are expressed easily in accordance with adhesiveness of a cell. Thus, the above-described effect of improving orientation of a cell can be obtained more easily.

A cell cultured in the cell sheet-forming member is not particularly limited. However, at least one of a myoblast cell, a fibroblast cell, and a myocardium cell, which are present particularly having orientation in an organism is more suitable. The plurality of flat portions may each have a length in a short-side direction of 10 µm or greater and 50 µm or less, and a length in the short-side direction of a gap between the plurality of flat portions adjacent to each other may be 10 µm or greater and 50 µm or less. According to this configuration, the length in the short-side direction of the flat portion and the length in the short-side direction of the recession/protrusion portion have a size suitable for orientation control of a myoblast cell, a fibroblast cell, and a myocardium cell. Thus, orientation of respective cells in a sheet of a myoblast cell, a sheet of a fibroblast cell, and a sheet of a myocardium cell can be improved.

The surface of the cell sheet-forming member may have hydrophilicity or hydrophobicity.

The surface of the cell sheet-forming member may include metal or an organic material.

BRIEF DESCRIPTION OF DRAWINGS

FIGS. 1A to 1D are views illustrating a configuration of a cell sheet-forming member according to an embodiment.

DESCRIPTION OF EMBODIMENTS

Hereinafter, description will be made on a cell sheet-forming member, a method of manufacturing a cell sheet-forming member, and a method of manufacturing a cell sheet according to an embodiment. First, description will be made on a configuration of the cell sheet-forming member, and then, description will be made on the method of manufacturing a cell sheet-forming member and the method of manufacturing a cell sheet.

Cell Sheet-Forming Member

Figure 1A:
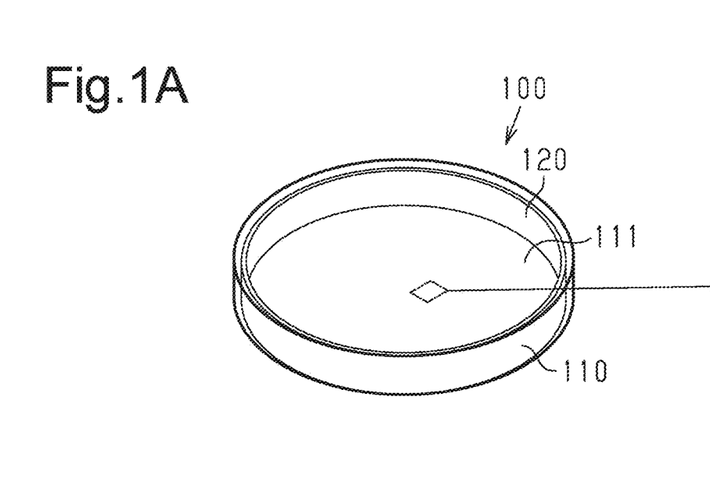
FIG. 1A is a perspective view illustrating the configuration of the cell sheet-forming member together with a petri dish.

As illustrated in FIG. 1A, a cell sheet-forming member 100 is, for example, a sheet member placed in a culture plate 110 of a petri dish. The petri dish retains cell suspension a space surrounded by the culture plate 110 and a lid 120. Examples of a cell present in the cell suspension include a myoblast cell, a fibroblast cell, and a myocardium cell.

Figure 1B:
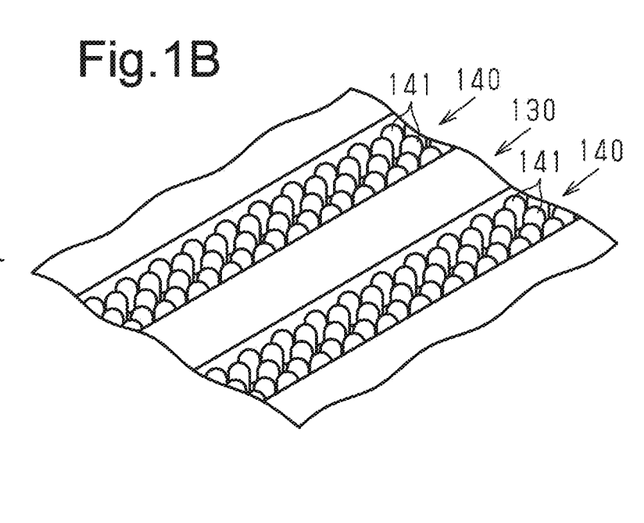
FIG. 1B is an enlarged perspective view illustrating a part of a surface of the cell sheet-forming member.

As illustrated in FIG. 1B, a surface 111 of the cell sheet-forming member 100 includes a plurality of flat portions 130 and a plurality of recession/protrusion portions 140. Each of the recession/protrusion portion 140 includes a plurality of stepped structures, and the plurality of stepped structures fill a gap between the flat portions 130 adjacent to each other. The stepped structures include protrusion portions or recession portions. Note that the stepped structures in the present embodiment include protrusion portions 141. The recession/protrusion portion 140 includes a recession portion sandwiched between the flat portions 130 adjacent to each other and a plurality of the protrusion portions 141 positioned in a bottom surface of the recession portion. In other words, the plurality of protrusion portions 141 are provided in the bottom surface of the recession portion corresponding to a portion sandwiched between the flat portions 130 adjacent to each other in the cell sheet-forming member 100.

Figure 1C:
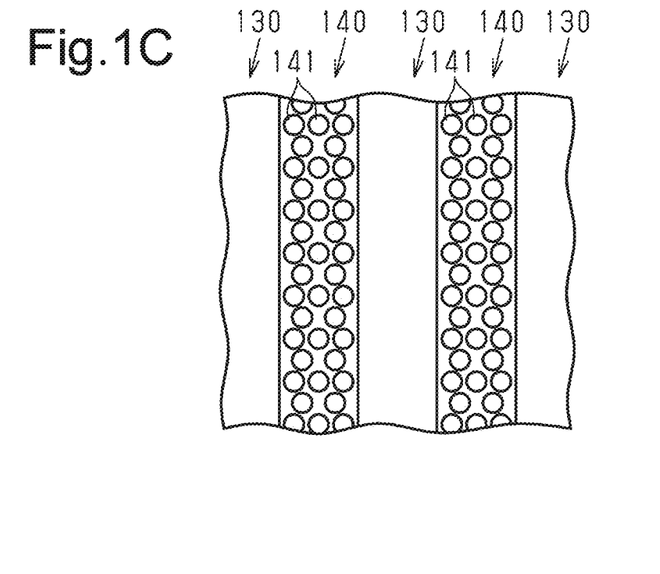
FIG. 1C is an enlarged plan view illustrating a part of the surface of the cell sheet-forming member.
Figure 8:
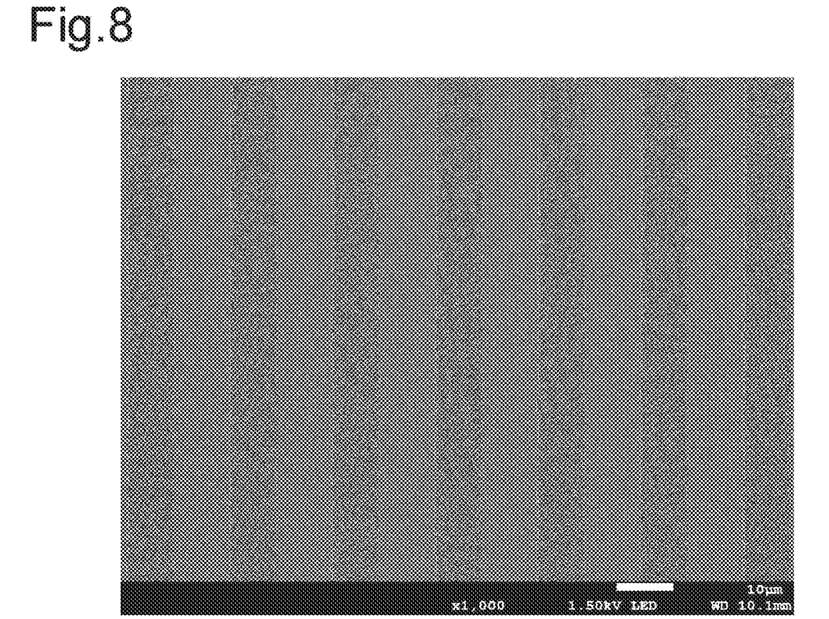
FIG. 8 is an image obtained by capturing a surface of the cell sheet-forming member in FIGS. 1A to 1D with a scanning electron microscope.
Figure 9:
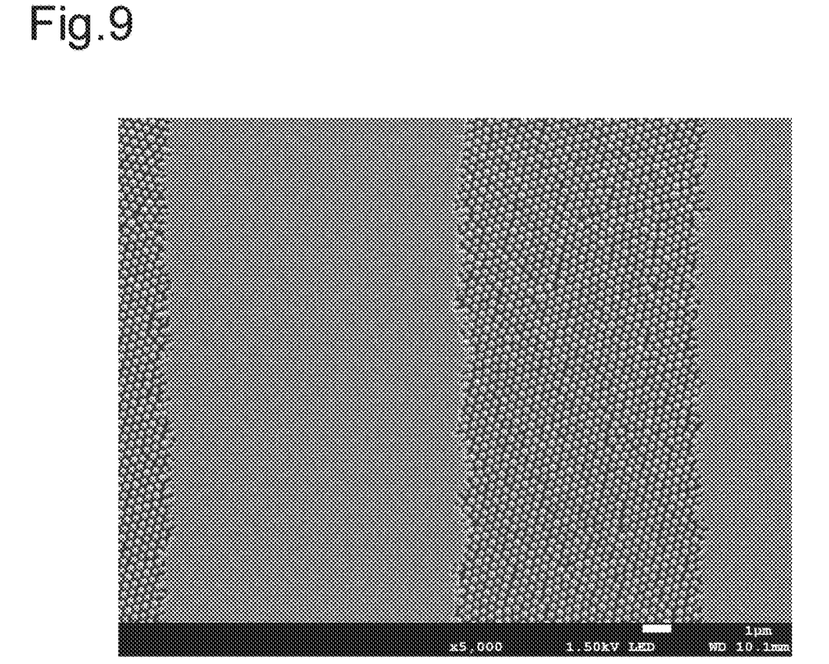
FIG. 9 is an enlarged image illustrating a part of the image in FIG. 8.

As illustrated in FIG. 1C, each of the flat portions 130 is a flat surface extending in a first direction being one direction (a vertical direction in FIG. 1C). The plurality of flat portions 130 are arrayed in a second direction orthogonal to the first direction (a horizontal direction in FIG. 1C) over an entirety of the surface 111. Each of the recession/protrusion portions 140 also extends in the first direction. Additionally, the plurality of recession/protrusion portions 140 are arrayed in the second direction over an entirety of the surface 111. As illustrated in FIG. 8 and FIG. 9, this is also clearly understood from images obtained by capturing the surface of the cell sheet-forming member 100 with a scanning electron microscope.

Each of the protrusion portions 141 being constituent elements of the recession/protrusion portion 140 is positioned at, for example, each apex of a triangular lattice pattern as seen in a direction facing the surface 111. In each of the recession/protrusion portions 140, such arrangement of the protrusion portions 141 is repeated in the first direction and the second direction. In the case of the recession/protrusion portions 140 in which the protrusion portions 141 are positioned at the apexes of the triangular lattice pattern, an original plate for forming the protrusion portions 141 can be formed by an etching method using a mask suitable for forming a finely-repeated structure, for example, using a single particle film as a mask.

As seen in the direction facing the surface 111, each of the protrusion portions 141 has, for example, a circular shape. A most frequent value of a distance between centers of the protrusion portions 141 adjacent to each other is a pitch of the protrusion portions 141. Additionally, a maximum width of the protrusion portion in a plan view shape of the protrusion portion 141 is a diameter of the protrusion portion 141.

A configuration in which the pitch of the protrusion portions 141 satisfies the following (A) and (B) is suitable in view of aligning an extension direction of an animal cell, particularly, the myoblast cell, the fibroblast cell, and the myocardium cell as described above with the first direction. That is, the configuration in which the pitch of the protrusion portions 141 satisfies the following (A) and (B) is suitable in view of clearly defining a difference between the flat portions 130 and the recession/protrusions 140 in higher and lower likeliness of adherence of an animal cell, particularly, the myoblast cell, the fibroblast cell, and the myocardium cell as described above to the flat portions 130 and the recession/protrusion portions 140.

(A) The pitch of the protrusion portions 141: 100 nm or more and 10 µm or less
(B) The diameter of the protrusion portion 141: 50% or greater and 100% or less of the pitch of the protrusion portions 141

The length in the second direction (a short-side direction) of each of the flat portions 130 is the width of the flat portion 130. Additionally, the length in the second direction (the short-side direction) between the flat portions 130 adjacent to each other is the width of the recession/protrusion portion 140.

The width of the flat portion 130 and the width of the recession/protrusion portion 140 are, for example, 1/10 times or more and 10 times or less a size of a cell (5 µm or greater and 100 µm or less) that is a culture target. A configuration in which the width of the flat portion 130 and the width of the recession/protrusion portion 140 satisfy the following (C) and (D) is suitable in view of facilitating alignment of the extension direction of an animal cell, particularly, the myoblast cell, the fibroblast cell, and the myocardium cell as described above with the first direction.

Figure 1D:
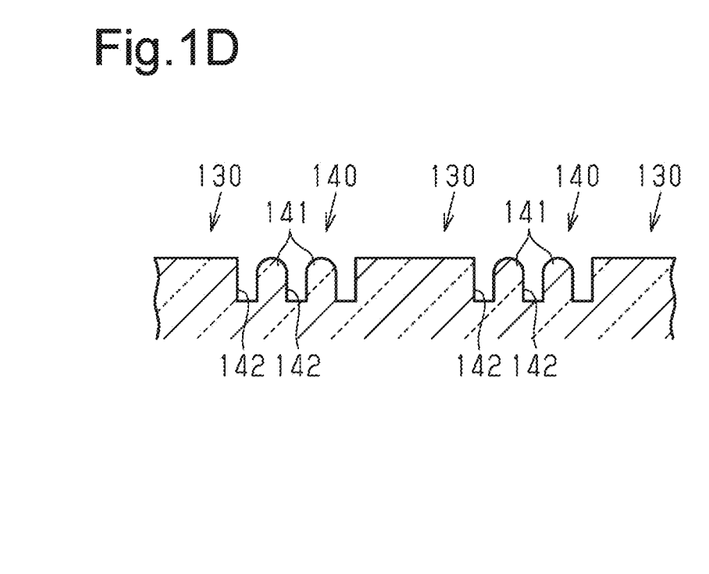
FIG. 1D is an enlarged partially cross-sectional view illustrating a part of the cell sheet-forming member.

(C) The width of the flat portion 130: 10 µm or more and 50 µm or less
(D) The width of the recession/protrusion portion 140: 10 µm or more and 50 µm or less As illustrated in FIG. 1D, the recession/protrusion portion 140 may include recession portions 142 between the protrusion portions 141 adjacent to each other and between the flat portion 130 and the protrusion portion 141 adjacent to the flat portion 130. The plurality of protrusion portions 141 are present in the recession/protrusion portion 140 in a scattered manner, and thus the recession portions 142 being spaces among the protrusion portions 141 are continuous in the first direction and the second direction in the recession/protrusion portion 140.

In a thickness direction of the cell sheet-forming member 100, a length between a bottom surface of each of the recession portions 142 and the flat portion 130 is a height of the flat portion 130. Additionally, in the thickness direction of the cell sheet-forming member 100, a difference of elevation between a distal end surface of each of the protrusion portions 141 and the flat portion 130 is a boundary level difference. A difference of elevation between the bottom surface of the recession portion 142 and the distal end surface of each of the protrusion portions 141 is the height of the protrusion portion 141. In a configuration in which the distal end surface of each of the protrusion portions 141 and the flat portion 130 are flush with each other, the height of the flat portion 130 and the height of the protrusion portion 141 are equal to each other. A ratio of the pitch of the protrusion portions 141 to the height of the protrusion portion 141 is an aspect ratio of the protrusion portion 141.

A configuration in which the boundary level difference satisfies the following (E) is suitable in view of enhancing flatness of a cell sheet. A configuration in which the height of the protrusion portion 141 satisfies the following (F) and a configuration in which the aspect ratio of the protrusion portion 141 satisfies the following (G) are suitable in view of enhancing structural stability of the recession/protrusion portion 140 and also in view of facilitating formation of the recession/protrusion portion 140.

(E) The boundary level difference: 0.5 µm or less, preferably, 0.3 µm or less
(F) The height of the protrusion portion 141: 50 nm or more and 5 µm or less
(G) The aspect ratio of the protrusion portion 141: 0.1 or more and 10 or less The flat portions 130 and the recession/protrusion portions 140 constitute the surface for forming a cell sheet, and have a relationship in which one is defined by the other. Then, according to the configuration satisfying the above-described (A) and (B), in any of a case where a cell is more likely to adhere to the flat portions 130 and a case where a cell is more likely to adhere to the recession/protrusion portions 140, the cell preferentially adheres to one of the structural bodies and is less likely to adhere to the other structural body. Thus, in combination with such characteristics of a cell, the extension direction of a cell is aligned with the first direction being the extending direction of both the structural bodies. As a result, in a cell sheet spreading in a two-dimensional direction along the surface 111, the extension direction of a cell can be aligned with a one-dimensional direction, that is, orientation of a cell can be improved.

Additionally, in a cell sheet formed to cover the recession/protrusion portions 140 and the flat portions 130, the configuration satisfying the above-described (E), particularly, the configuration in which the distal end surface of each of the protrusion portions 141 and the flat portion 130 is flush with each other can enhance flatness of a cell sheet. Further, the configuration satisfying the above-described (F) can further enhance flatness of a cell sheet.

Note that, the surface 111 of the cell sheet-forming member 100 includes the flat portions 130 and the recession/protrusion portions 140, and thus, the cell sheet-forming member 100 can be applied in common to both the case of a cell which is more likely to adhere to the flat portions 130 and the case of a cell which is more likely to adhere to the recession/protrusion portions 140. That is, versatility of the cell sheet-forming member 100 can also be enhanced.

Additionally, for the purpose of enhancing adhesiveness of a cell, for example, the surface 111 of the cell sheet-forming member 100 may be coated with an organic material including an adhesion factor such as an extracellular matrix, a polymer, and gel, or may be a surface including metal. Examples of the extracellular matrix include laminin, collagen, gelatine, fibronectin, polylysine (PDL or PLL), and hyaluronic acid, but are not limited thereto. Additionally, the surface 111 of the cell sheet-forming member 100 may have hydrophilicity or hydrophobicity for the purpose of enhancing adhesiveness of a cell and flatness of a cell sheet.

Additionally, to facilitate peeling and recovering of a cell sheet after the cell sheet is formed, a stimulus-responsive material may be applied. As the stimulus-responsive material, a temperature-responsive polymer having hydrophilicity that changes in accordance with temperature change is preferred. Specifically, poly-N-isopropylacrylamide (PIPAAm) is preferred. The stimulus-responsive material may be applied to a substrate with use of a commonly-used coating method, or a structure may be formed with use of a method described below in a substrate treated with the stimulus-responsive material.

Method of Manufacturing Cell Sheet-Forming Material

Next, description will be made on an example of a method of manufacturing a cell sheet-forming member. Note that, in the following description, description will be made on an example in which the surface 111 of the cell sheet-forming member is formed with use of a nanoimprint method by transference of a recessed plate 150.

Figure 2:
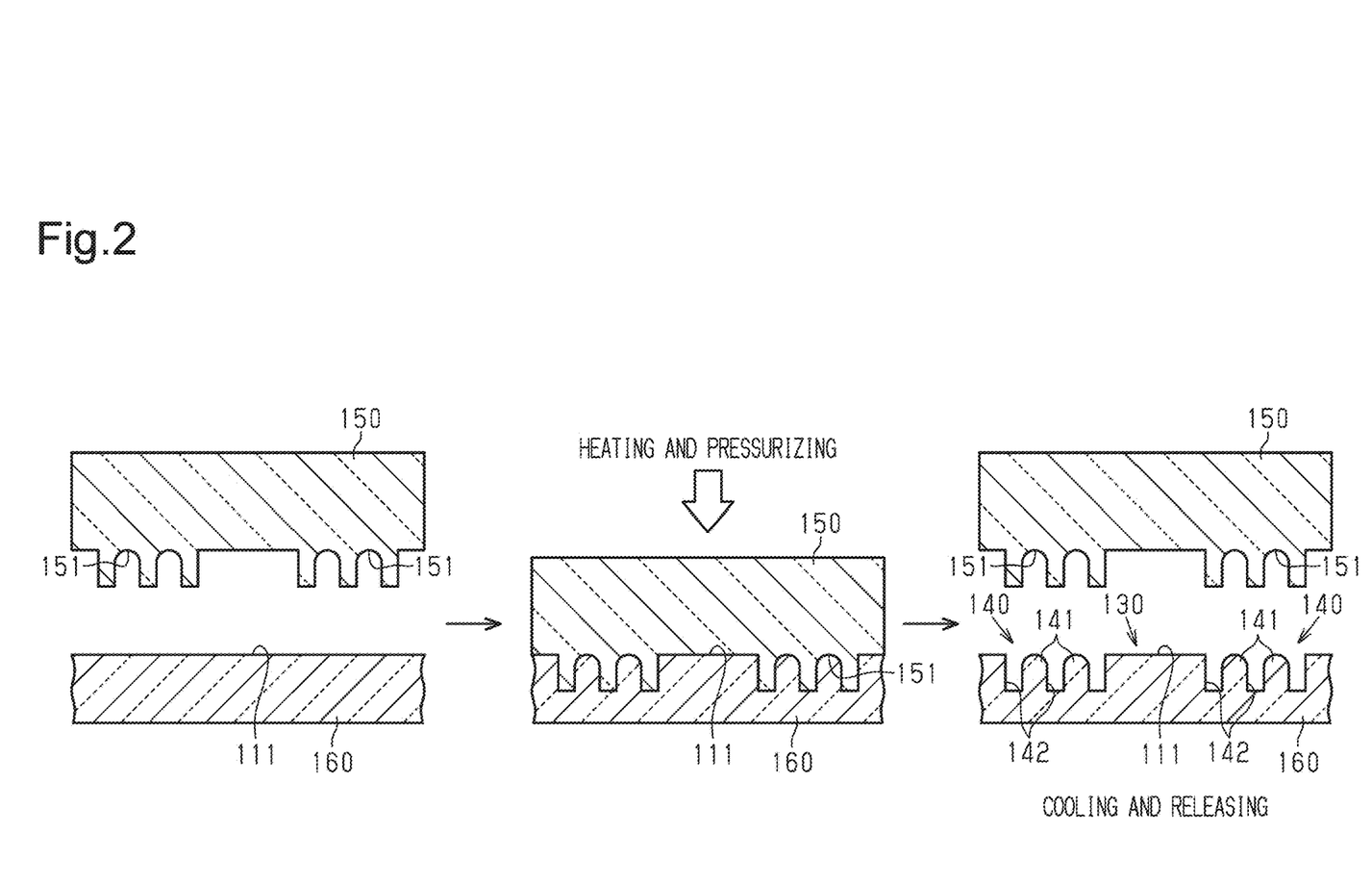
FIG. 2 is a step view illustrating an example of a method of manufacturing the cell sheet-forming member in FIGS. 1A to 1D.

As illustrated in FIG. 2, the method of manufacturing the cell sheet-forming member includes the steps of forming the recessed plate 150, and forming the surface 111 of the cell sheet-forming member 100 by transference of the recessed plate 150.

A lower surface of the recessed plate 150 has a shape extending in the first direction (a direction orthogonal to the drawing sheet), and includes a plurality of flat portions arrayed in the second direction (a horizontal direction of the drawing sheet) intersecting the first direction, and recession/protrusion portions including a plurality of stepped structures filling a gap between the flat portions adjacent to each other. The flat portions of the recessed plate 150 are portions for forming the flat portions 130 of the cell sheet-forming member 100 by transference. The recession/protrusion portions of the recessed plate 150 are portions for forming the recession/protrusion portions 140 of the cell sheet-forming member 100 by transference.

The stepped structures of the recessed plate 150 include protrusion portions or recession portions. Note that, the stepped structures of the recessed plate 150 in the present embodiment include recession portions 151 for forming the protrusion portions 141, and a pitch of the recession portions 151 is 100 nm or more and 10 μm or less. The step of forming the recessed plate 150 includes, for example, forming the recession/protrusion portions with use of at least one of a photolithographic method, a colloidal lithographic method, an anodization method, and an interference exposure method with respect to a silicon substrate for forming the recessed plate 150. Additionally, the recessed plate 150 itself may be obtained by performing transference once or a plurality times of transference from an original plate. For example, a shape in conformity with a surface shape of the recessed plate 150 is made in the original plate with use of at least one of a photolithographic method, a colloidal lithographic method, an anodization method, and an interference exposure method with respect to a silicon substrate.

Next, the lower surface of the recessed plate 150 is caused to face the surface 111 of a base 160 for forming the cell sheet-forming member 100. A formation material of the base 160 is, for example, a thermoplastic resin or a photocurable resin. Then, under a state in which the base 160 has fluidity, the lower surface of the recessed plate 150 is pressed against the surface 111 of the base 160. Then, in a state in which fluidity of the base 160 is suppressed, the recessed plate 150 is released from the surface 111 of the base 160. Accordingly, the recession portions 151 of the recessed plate 150 are transferred to the surface 111 of the base 160, and the flat portions 130 and the recession/protrusion portions 140 are formed.

For the purpose of enhancing adhesiveness of a cell, a surface of the thermoplastic resin or the photocurable resin being the formation material of the base 160 may be coated with an organic material including an adhesion factor such as an extracellular matrix, a polymer, and gel. Examples of the extracellular matrix include laminin, collagen, gelatine, fibronectin, polylysine (PDL or PLL), and hyaluronic acid, but are not limited thereto. Additionally, as the formation material of the base 160, a biomaterial such as a polysaccharide and a protein may be used.

Method of Manufacturing Cell Sheet

Next, description will be made on a cell sheet to be manufactured with use of the cell sheet-forming member 100.

Figure 3A:
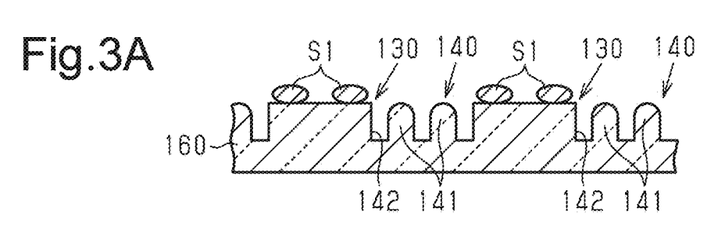
FIGS. 3A to 3C are each an explanatory schematic view of a process of manufacturing a cell sheet with use of the cell sheet-forming member in FIGS. 1A to 1D.
Figure 3B:
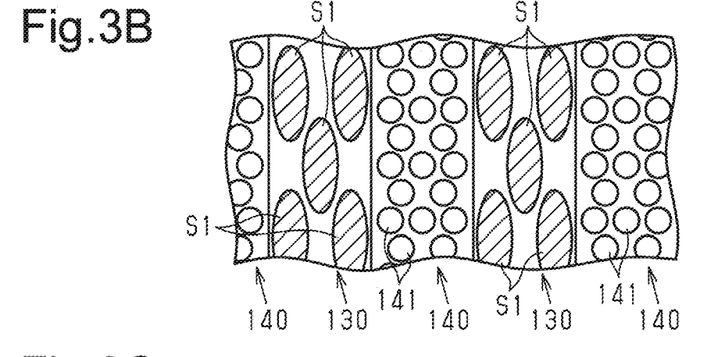
Figure 6:
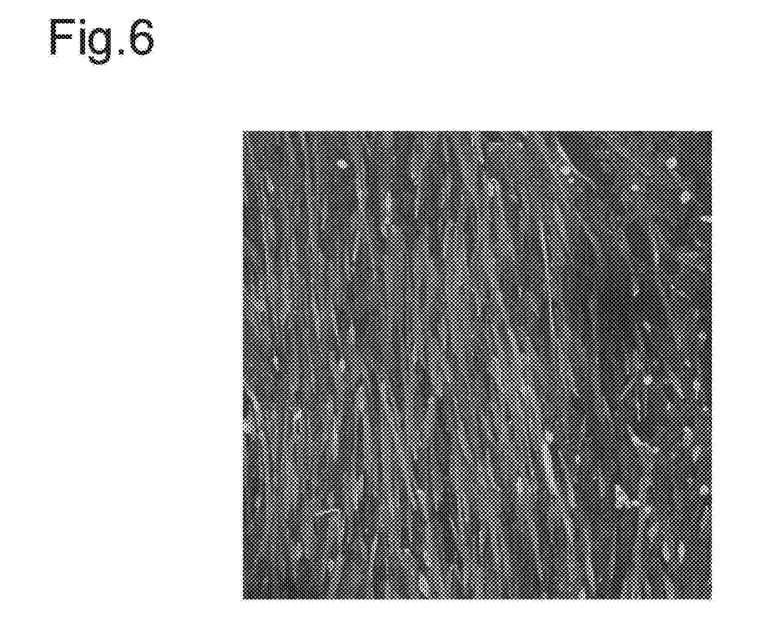
FIG. 6 is a fluorescent staining image of myoblast cells cultured with use of the cell sheet-forming member in FIGS. 1A to 1D.

As illustrated in FIG. 3A, cell suspension positioned on the surface 111 of the cell sheet-forming member 100 includes, for example, cells S1 that adhere to the flat portions 130. In this case, each of the flat portions 130 extends in the long-side direction (the first direction) of the recession/protrusion portions 140, and the width of each of the flat portions 130 is approximately several times a size of a general cell. Thus, as illustrated in FIG. 3B, positions of the cells S1 are preferentially distributed within the range of the flat portions 130, and the cells S1 are linearly continuous while the longitudinal axial direction of the cells is disposed in the first direction. That is, the extension directions of the cells S1 are controlled to be aligned with the long-side direction of the flat portions 130. FIG. 6 illustrates an example of myoblast cells cultured with use of the cell sheet-forming member 100. In the example illustrated in FIG. 6, the extension directions of the myoblast cells are controlled to be aligned with one direction.

Figure 3C:
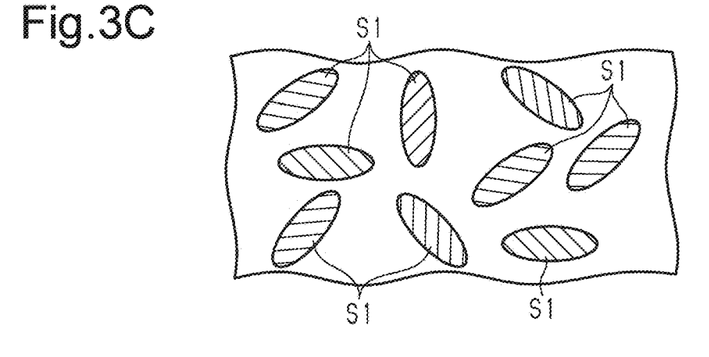
Figure 7:
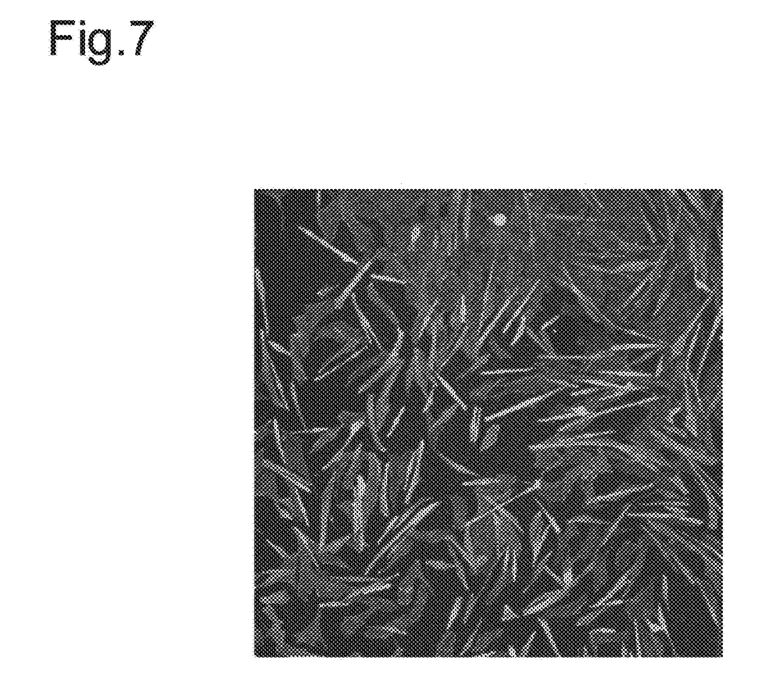
FIG. 7 is a fluorescent staining image of myoblast cells cultured with use of a cell culture petri dish as a reference example.

Note that, as illustrated in FIG. 3C, in the case of a cell sheet-forming substrate that does not satisfy the above-described (A), orientation of the cells S1 is not controlled, and thus, the longitudinal axial direction of the cells S1 is disposed in random directions. FIG. 7 illustrates an example of myoblast cells cultured with use of a commercially available cell culture petri dish as a reference example. In the example in FIG. 7, the extension directions of the myoblast cells are disposed randomly.

Figure 4A:
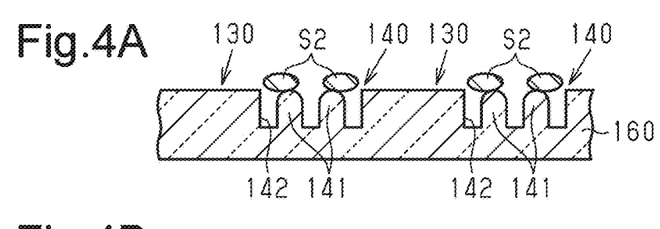
FIGS. 4A to 4C are each an explanatory schematic view of a process of manufacturing a cell sheet with use of the cell sheet-forming member in FIGS. 1A to 1D.
Figure 4B:
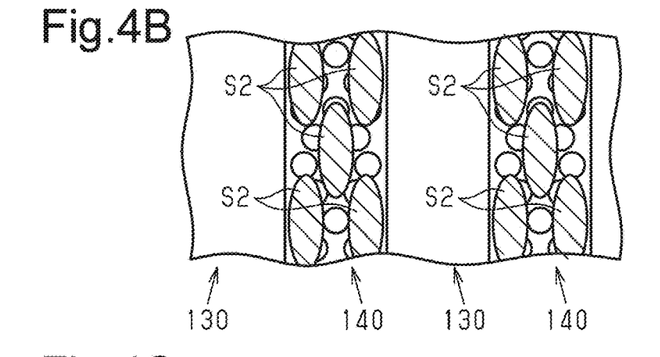

As illustrated in FIG. 4A, cell suspension positioned on the surface 111 of the cell sheet-forming member 100 includes, for example, cells S2 that adhere to the recession/ protrusion portions 140. In this case, each of the recession/protrusion portions 140 extends in the long-side direction (the first direction) of the recession/protrusion portion 140, and the width of each of the recession/protrusion portions 140 is approximately several times a size of a general cell. Thus, as illustrated in FIG. 4B, positions of the cells S2 are preferentially distributed within the range of the recession/protrusion portions 140, and the cells S2 are linearly continuous while the longitudinal axial direction of the cells is disposed in the first direction. That is, the extension directions of the cells S2 are controlled to be aligned with the long-side direction of the recession/protrusion portions 140.

Figure 4C:
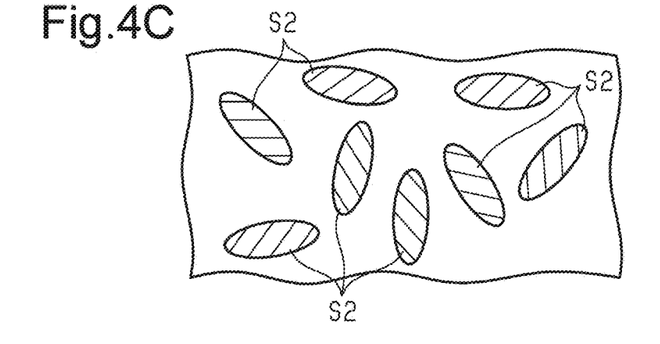

Note that, as illustrated in FIG. 4C, in the case of a cell sheet-forming substrate that does not satisfy the above-described (A), orientation of the cells S2 is not controlled, and thus, the longitudinal axial direction of the cells S2 is present in random directions.

Figure 5A:
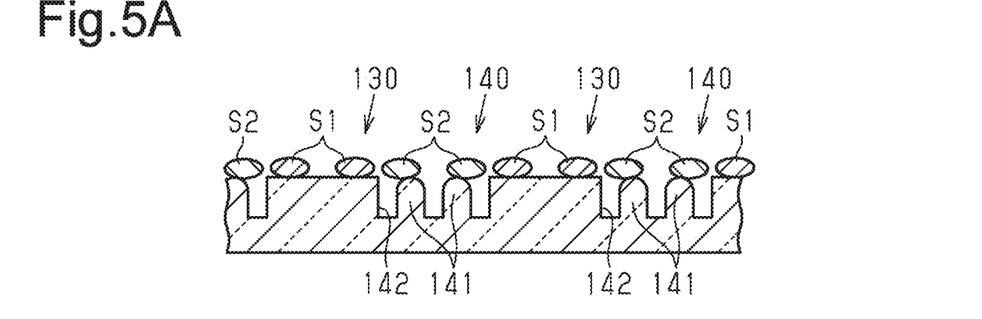
FIGS. 5A to 5C are each an explanatory schematic view of a process of manufacturing a cell sheet with use of the cell sheet-forming member in FIGS. 1A to 1D.

On the other hand, in the case of a cell sheet-forming substrate that satisfies the above-described (A), as illustrated in FIG. 5A, cells in a cell suspension retained in the cell sheet-forming member 100 are the cells S1 that preferentially adhere to the flat portions 130, and are also the cells S2 that are less likely to adhere to the recession/protrusion portions 140 than to the flat portions 130, but are allowed to adhere to the recession/protrusion portions 140. Alternatively, cells in cell suspension retained in the cell sheet-forming member 100 are the cells S2 that preferentially adhere to the recession/protrusion portions 140, and also the cells S1 that are less likely to adhere to the flat portions 130 than to the recession/protrusion portions 140, but are allowed to adhere to the flat portions 130.

Figure 5B:
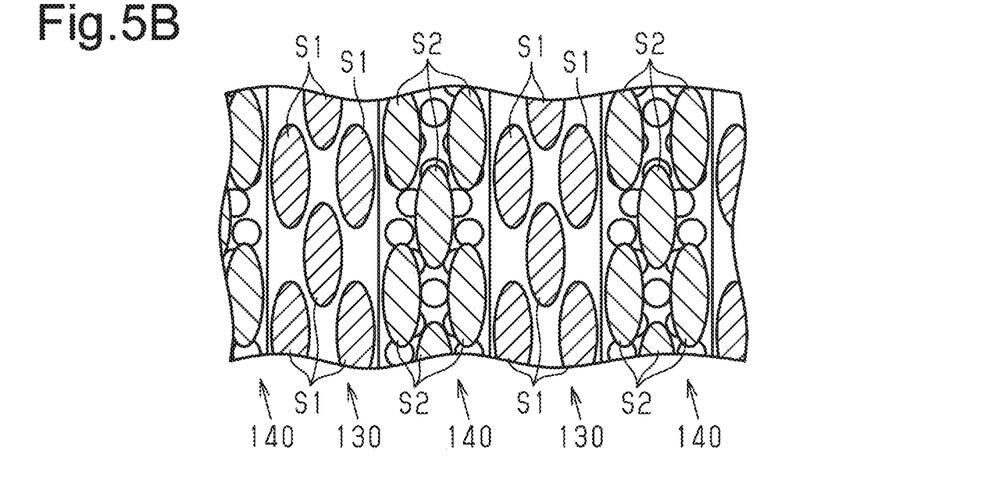

In this case, as illustrated in FIG. 5B, the flat portions 130 and the recession/protrusion portions 140 extend in the first direction, and are alternately disposed in the second direction. Thus, in the surface 111 of the cell sheet-forming member, for example, the orientation of the cells S1 that preferentially adhere to the flat portions 130 is controlled by the structures of the flat portions 130 and the structures of the recession/protrusion portions 140 that define the flat portions 130.

Figure 5C:
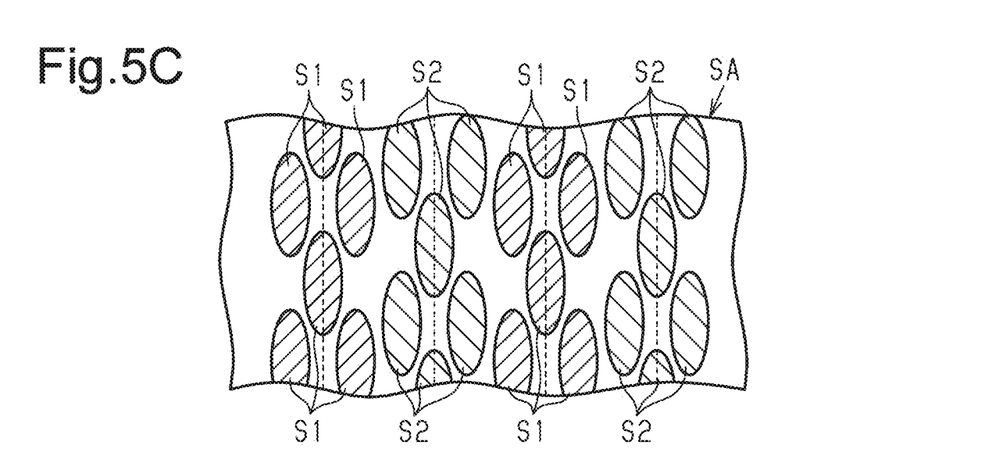

Then, orientation control performed by the flat portions 130 on the cells S2 that is less likely to adhere to the recession/protrusion portions 140 than to the flat portions 130, but adheres to the recession/protrusion portions 140 is reflected in the recession/protrusion portion 140 sandwiched between the flat portions 130 adjacent to each other. As a result, as illustrated in FIG. 5C, the cells S1 and S2 controlled to have orientation in the first direction form a cell sheet SA spreading over an entirety of the surface 111.

Alternatively, the orientation of the cells S2 that preferentially adhere to the recession/protrusion portions 140 is controlled by the structures of the recession/protrusion portions 140 and the structures of the flat portions 130 that define the recession/protrusion portions 140. Then, orientation control performed by the recession/protrusion portions 140 on the cells S1 that is less likely to adhere to the flat portions 130 than to the recession/protrusion portions 140, but adhere to the flat portions 130 is reflected in the flat portion 130 sandwiched between the recession/protrusion portions 140 adjacent to each other. As a result, as illustrated in FIG. 5C, the cells S1 and S2 controlled to have the orientation in the first direction form the cell sheet SA spreading over an entirety of the surface 111.

Description will be made below on examples of the cell sheet-forming member, the method of manufacturing a cell sheet-forming member, and the method of forming a cell sheet described in the above-described embodiment.

Example 1

Production of Cell Sheet-Forming Member

First, a nickel recessed plate for forming recession/protrusion portions 140 of a cell sheet-forming member 100 by transference was produced. Then, the nickel recessed plate was used as a stamper to form the recession/protrusion portions 140 into a polystyrene sheet surface by a nanoimprint method. Accordingly, the cell sheet-forming member 100 of Example 1 was produced. Flat portions 130 in the cell sheet-forming member 100 of Example 1 each had a shape extending in the first direction, and were arrayed in the second direction intersecting the first direction over an entirety of a surface of the cell sheet-forming member 100. The width of each of the flat portions 130 (the length in the second direction) was 10 μm. Each of the recession/protrusion portions 140 included a plurality of stepped structures filling a gap between the flat portions 130 adjacent to each other. The length in the second direction between the flat portions 130 adjacent to each other was 10 μm, and the pitch of protrusion portions 141 in the recession/protrusion portion 140 was 300 nm. As a result of measuring the height of each of the protrusion portions in the recession/protrusion portion 140 with use of an AFM, an average of the heights from bottom surfaces of recession portions to distal ends of the protrusion portions was 446 nm. Additionally, an average of the heights from the bottom surfaces of the recession portions to the flat portions was 455 nm. Then, the cell sheet-forming member 100 of Example 1 was cut into 10 mm squares. The cell sheet-forming member 100 of Example 1 obtained after the cutting was subjected to UV irradiation, and was used for a cell culture test after this sterilization treatment.

Cell Culture Test

First, mouse-derived myoblast cells (C2C12 cells available from DS Pharma Biomedical Co., Ltd.) were cultured in a cell culture flask (25 cm$^2$). The culture was performed in an atmosphere at 37° C. with 5% of $CO^2$ with use of a Dulbecco's Modified Eagle's Medium (DMEM) to which fetal bovine serum (FBS) was added by 10%. Trypsin was used for recovering the cells, and the recovering of the cells was carried out according to a usual method. The number of the recovered cells was measured with use of a hemocytometer, and then cell suspension having concentration of $3.8 \times 10^4$ cells/ml was prepared.

Then, in a bottom surface of a cell culture multiwell plate (with 24 pores), the cell sheet-forming member 100 of Example 1 that was cut into 10 mm squares was installed. After phosphate buffered saline was divide by 0.5 ml and injected to the multiwell plate, the phosphate buffered saline was removed to wash the cell sheet-forming member 100 of Example 1. Subsequently, cell suspension prepared in advance was divide by 0.5 ml and injected, and cells were seeded. The cells seeded in the multiwell plate were cultured in an atmosphere at 37° C. with 5% of $CO^2$, and a medium was replaced every two days until a confluent state was obtained. After the confluent state was confirmed, the medium was replaced with a myotube induction medium (a DMEM medium containing no FBS), and myotube differentiation induction was performed. As a result, myotube formation was confirmed two days after the myotube differentiation induction.

Then, in a state in which the cells obtained after the myotube formation adhered to the cell sheet-forming member 100, the cells obtained after the myotube formation were fixed for 10 minutes at a room temperature with use of 4% paraformaldehyde (phosphate buffered saline). After the solution used for the fixing was removed, the cells were washed with phosphate buffered saline. Subsequently, the cells were treated for 5 minutes at a room temperature with use of phosphate buffered saline including 0.5% Triton X-100, and were permeabilized. After the cells were washed with phosphate buffered saline, the cells were immersed for 30 minutes in acti-stain 488 Phalloidin (available from Cytoskeleton, Inc.) solution diluted to 100 nM, and were dyed. After the cell sheet-forming member 100 obtained after the dyeing was washed with phosphate buffered saline, the cell sheet-forming member 100 was pasted to a microscope slide to which a mounting medium (Antifade mounting medium available from Fluka) was dripped, and an observation microscope slide was produced. Then, a confocal laser microscope (available from Olympus Corporation) was used to observe orientation of the cells. As a result, in the cell sheet-forming member 100 of Example 1, a state in which the extension directions of the cells were aligned with a one-dimensional direction was confirmed.

Example 2

A nickel recessed plate different from the nickel recessed plate of Example 1 was used to produce a cell sheet-forming member 100 of Example 2 in a similar manner to in Example 1. The width of each of flat portions 130 in the cell sheet-forming member 100 of Example 2 was 30 μm, the length in the second direction between the flat portions 130 adjacent to each other was 30 μm, and the pitch of protrusion portions 141 in a recession/protrusion portion 140 was 600 nm. As a result of measuring the height of each of the protrusion portions in the recession/protrusion portion 140 with use of an AFM, an average of the heights from bottom surfaces of recession portions to distal ends of the protrusion portions was 724 nm. Additionally, an average of the heights from the bottom surfaces of the recession portions to the flat portions was 900 nm.

The cell sheet-forming member 100 of Example 2 was used to culture myoblast cells by a method similar to in Example 1. After formation of myotube cells was confirmed, the cells were fixed and an observation microscope slide was produced. Then, orientation of the cells was observed with use of a fluorescence microscope. As a result, in the cell sheet-forming member 100 of Example 2, a state in which the extension directions of the cells were aligned with a one-dimensional direction was confirmed.

Example 3

A nickel recessed plate different from the nickel recessed plates of Examples 1 and 2 was used to produce a cell sheet-forming member 100 of Example 3 in a similar manner to in Example 1. The width of each of flat portions 130 in the cell sheet-forming member 100 of Example 3 was 50 μm, the length in the second direction between the flat portions 130 adjacent to each other was 50 μm, and the pitch of protrusion portions 141 in a recession/protrusion portion 140 was 600 nm. As a result of measuring the height of each of the protrusion portions in the recession/protrusion portion 140 with use of an AFM, an average of the heights from bottom surfaces of recession portions to distal ends of the protrusion portions was 717 nm. Additionally, an average of the heights from the bottom surfaces of the recession portions to the flat portions was 900 nm.

The cell sheet-forming member 100 of Example 3 was used to culture myoblast cells by a method similar to in Example 1. After formation of myotube cells was confirmed, the cells were fixed, and an observation microscope slide was produced. Then, orientation of the cells was observed with use of a fluorescence microscope. As a result, in the cell sheet-forming member 100 of Example 3, a state in which the extension directions of the cells were aligned with a one-dimensional direction was confirmed.

Comparative Example 1

A polystyrene sheet was cut into 10 mm squares to obtain a cell sheet-forming member of Comparative Example 1 that is a sheet material including a flat surface including no recession protrusion portion 140. Then, in a similar manner to in Example 1, after the cell sheet-forming member of Comparative Example 1 is subjected to sterilization treatment with UV irradiation, the cell sheet-forming member of Comparative Example 1 was used for a cell culture test.

That is, the cell sheet-forming member of Comparative Example 1 was used to culture myoblast cells by a method similar to in Example 1. After formation of myotube cells was confirmed, the cells were fixed, and an observation microscope slide was produced. Then, orientation of the cells was observed with use of a fluorescence microscope. As a result, in the cell sheet-forming member of Comparative Example 1, it was confirmed that the directions in which the cells extended were random.

Example 4

First, the cell sheet-forming member 100 of Example 1 was cut into 10 mm squares, and was subjected to sterilization treatment with UV irradiation. Then, the cell sheet-forming member 100 was installed in a bottom surface of a cell culture multiwell plate (with 24 pores), and was further subjected to fibronectin coating. In this case, after the cell sheet-forming member 100 was immersed in a regulated amount of fibronectin coating solution and left overnight at 37° C., the cell sheet-forming member 100 was washed twice with distilled water, and this was used for cell culture as a cell sheet-forming member 100 of Example 4.

Then, as mouse-derived myocardium cells, a myocardium cell culture kit (available from Cosmo Bio Co., Ltd.) was used to prepare cell suspension having concentration of $2 \times 10^5$ cells/ml. The prepared cell suspension was divided by 0.5 ml and injected to seed the cells. The cells seeded in the multiwell plate were cultured in an atmosphere at 37° C. with 5% of $CO^2$, and a medium was replaced every two days until a confluent state was obtained. After the cells were cultured until the sixth day, in a state in which the cells adhered to the cell sheet-forming member 100, the cells were fixed for 10 minutes at a room temperature with use of 4% paraformaldehyde (phosphate buffered saline). After the solution used for the fixing was removed, the cells were washed with phosphate buffered saline. Subsequently, the cells were treated for 5 minutes at a room temperature with use of phosphate buffered saline including 0.5% Triton X-100, and were permeabilized. After the cells were washed with phosphate buffered saline, the cells were immersed for 30 minutes in acti-stain 488 Phalloidin (available from Cytoskeleton, Inc.) solution diluted to 100 nM, and were dyed. After the cell sheet-forming member 100 obtained after the dyeing was washed with phosphate buffered saline, the cell sheet-forming member 100 was pasted to a microscope slide to which a mounting medium (Antifade mounting medium available from Fluka) was dripped, and an observation microscope slide was produced. Then, a confocal laser microscope (available from Olympus Corporation)

was used to observe orientation of the myocardium cells. As a result, in the cell sheet-forming member 100 of Example 4, a state in which the extension directions of the cells were aligned with a one-dimensional direction was confirmed.

Comparative Example 2

The cell sheet-forming member of Comparative Example 1 was installed in a bottom surface of a cell culture multi well plate (with 24 pores). The cell sheet-forming member was subjected to fibronectin coating by a method similar to in Example 4, and this was used for cell culture as a cell sheet-forming member of Comparative Example 2. Specifically, culture of myocardium cells was performed by a method similar to in Example 4. On the sixth day from the start of the culture, an observation slide glass was produced to observe orientation of the cells. As a result, in the cell sheet-forming member of Comparative Example 2, it was confirmed that the directions in which the cells extended were random.

Example 5

Transference of a recession/protrusion portion 140 by a nanoimprint method was performed by a method similar to the method of manufacturing the cell sheet-forming member of Example 1 on a petri dish obtained by adding a temperature-responsive polymer to a surface of a polystyrene cell sheet-forming member (Product name: UpCell (registered trademark) available from CellSeed Inc.), and a cell sheet-forming member 100 of Example 5 was produced. Note that, the width of each of flat portions 130 in the cell sheet-forming member 100 of Example 5 was 10 μm, the length between the flat portions 130 adjacent to each other was 10 μm, and the pitch of protrusion portions 141 in a recession/protrusion portion 140 was 300 nm. As a result of measuring the heights of the protrusion portions in the recession/protrusion portion 140 with use of an AFM, an average of the heights from bottom surfaces of recession portions to distal ends of the protrusion portions was 432 nm. Additionally, the height from the bottom surface of the recession portion to the flat portion was 440 nm. Then, the cell sheet-forming member 100 of Example 5 was cut into 10 mm squares. The cell sheet-forming member 100 obtained after the cutting was subjected to sterilization treatment with UV irradiation, and was used for a cell culture test after this sterilization treatment.

The cell sheet-forming member 100 of Example 5 was used to carry out two types of tests as myoblast cell culture.

In a first culture test, a method similar to in Example 1 was used to culture the myoblast cells. Then, after formation of myotube cells was confirmed, an observation microscope slide was produced to observe orientation of the cells. As a result, a state in which the extension directions of the cells were aligned with a one-dimensional direction was confirmed.

In a second culture test, a temperature-responsive function of the cell sheet-forming member 100 was utilized to carry out recovering of the cell sheet. That is, the seeded myoblast cells were cultured until a confluent state was obtained. The cell sheet-forming member 100 to which the cells were attached was cooled for a predetermined time period. Then, a support membrane (Product name: Cell-Shifter available from CellSeed Inc.) was caused to closely adhere to a culture surface of the cell sheet-forming member 100. In a state in which the cells were attached to the support body, a cell sheet was peeled off from the cell sheet-forming member 100. The cell sheet that was peeled off was left on collagen gel in a state in which the cell sheet was attached to the support body. After a certain time period elapsed, only the support body was removed. Then, the cell sheet that was peeled off from the cell sheet-forming member 100 and moved to the collagen gel was observed with a microscope. As a result, it was confirmed that the cell sheet was able to be recovered by the area of 70% or more with respect to the culture area.

Comparative Example 3

A petri dish obtained by adding a temperature-responsive polymer to a surface of a polystyrene cell sheet-forming member (Product name: UpCell (registered trademark) available from CellSeed Inc.) was cut into 10 mm squares to produce a cell sheet-forming member of Comparative Example 3 including a flat surface including no recession/protrusion portion 140. The cell sheet-forming member of Comparative Example 3 was installed in a bottom surface of a cell culture multiwell plate (with 24 pores). A first culture test and a second culture test using myoblast cells were performed by a method similar to in Example 5. In the first culture test, it was confirmed that the directions in which the cells extended were random in the cell sheet-forming member of Comparative Example 3. In the second culture test, it was confirmed that the cell sheet was able to be recovered by the area of 70% or more with respect to the culture area.

According the embodiment described above, the following effects are obtained.

(1) In any of a case where a cell is more likely to adhere to the flat portions 130 and a case where a cell is more likely to adhere to the recession/protrusion portions 140, the cell preferentially adheres to one of the structural bodies and is less likely to adhere to the other structural body. In combination with such characteristics, the extension direction of the cell is aligned with the first direction that is the extending direction of both the structural bodies. As a result, in a cell sheet spreading in a two-dimensional direction, the extension direction of the cell can be aligned with a one-dimensional direction, that is, orientation of the cell can be improved.

(2) The surface 111 of the cell sheet-forming member 100 includes the flat portions 130 and the recession/protrusion portions 140. Thus, the cell sheet-forming member 100 can be applied in common to both the case of a cell that is more likely to adhere to the flat portions 130 and the case of a cell that is more likely to adhere to the recession/protrusion portions 140. That is, versatility of the cell sheet-forming member 100 can also be enhanced.

(3) According to the configuration in which level difference between the distal end surface of the recession/protrusion portion 140 and the flat portion 130 is 0.5 μm or less, preferably, 0.3 μm or less, more preferably, the distal end surface of the recession/protrusion portion 140 and the flat portion 130 are flush with each other, flatness of a cell sheet can be enhanced.

(4) According to the configuration in which, in the thickness direction of the cell sheet-forming member, the height of the distal end surface of the recession/protrusion portion is equal to or less than the height of the flat portion, orientation of a cell sheet can further be enhanced.

(5) When the aspect ratio of the stepped structure is 0.1 or more and 10 or less, higher likeliness of adherence to the flat portions 130 and higher likeliness of adherence to the recession/protrusion portions 140 are easily expressed appropriately in accordance with adhesiveness that a cell has. Thus, an effect of improving orientation of a cell can be obtained more easily. Additionally, mechanical strength in the stepped structure is also secured.

(6) When the width of the flat portion 130 is 10 μm or more and 50 μm or less, and the width of the recession/protrusion portion 140 is 10 μm or more and 50 μm or less, orientation of a cell in a sheet of an animal cell, particularly, orientation of respective cells in a sheet of a myoblast cell, a sheet of a fibroblast cell, and a sheet of a myocardium cell can be improved.

Note that modifications of the embodiment described above may be carried out as described below.

Recession/Protrusion Portions

The shape that the protrusion portion 141 has can be any one of a conoidal shape such as a cone and a pyramid, a columnar shape such as a cylinder and a prism, a truncated conoidal shape such as a truncated cone and a truncated pyramid, and a semi-spherical shape.

The position of the protrusion portion 141 can be set at each lattice point on a square lattice pattern and each lattice point on a hexagonal lattice pattern, and further can be set randomly in the recession/protrusion portion 140.

The shape that the recession/protrusion portion 140 has is not limited to a linear shape extending in the first direction, and can be modified to be a folded line shape extending in the first direction or a curved line shape extending in the first direction.

The bottom surfaces of the recession/protrusion portions 140 and the flat portions 130 can be modified to be flush with each other, that is, base end portions of the protrusion portions 141 and the flat portions 130 can be modified to be flush with each other. Note that, as described above, the configuration in which the distal end surfaces of the recession/protrusion portions 140 and the flat portions 130 are flush with each other is suitable in view of enhancing flatness of a cell sheet.

The stepped structure constituting the recession/protrusion portion 140 can be modified to include the recession portions, and can be modified to include both the recession portions and the protrusion portions. For example, the recession/protrusion portion 140 can include one side surface continuous to the flat portion 130, and may be modified to include a structure in which a plurality of recession portions are formed in the side surface.

The width of one recession/protrusion portion 140 and the width of the other recession/protrusion portion 140 may be different from each other, or may be equal to each other. Note that, when the width of the one recession/protrusion portion 140 and the width of the other recession/protrusion portion 140 are equal to each other, uniformity in the second direction can be enhanced for the property of a cell sheet.

Flat Portions

The width of one flat portion 130 and the width of the other flat portion 130 may be different from each other, or may be equal to each other. Note that, the width of the one flat portion 130 and the width of the other flat portion 130 are equal to each other, uniformity in the second direction can be enhanced for the property of a cell sheet.

The width of the flat portion 130 and the width of the recession/protrusion portion 140 may be different from each other, or may be equal to each other. For example, when a cell is more likely to adhere to the flat portions 130, it is suitable that the width of the flat portion 130 fall within the range of enabling orientation control and be larger than the width of the recession/protrusion portion 140. Additionally, when a cell is more likely to adhere to the recession/protrusion portions 140, it is suitable that the width of the recession/protrusion portion 140 fall within the range of enabling orientation control and be larger than the width of the flat portion 130.

Other Configurations

The second direction in which the flat portions 130 and the recession/protrusions portions 140 are alternately arrayed is not limited to a direction orthogonal to the first direction, and as long as the second direction intersects the first direction, the second direction can be a direction having an angle formed with the first direction of, for example, 45 degrees.

For the cell sheet-forming member, in addition to a transference body using the recessed plate, a transference body using a protruding plate may be used, and further, a molded article formed by injection molding can also be used. That is, the cell sheet-forming member can be manufactured by using injection molding.

The cell sheet-forming member is applicable to a multi-well plate, a petri dish, a flask, a chamber slide, and the like as long as cell suspension can be retained.

The invention claimed is:

1. An apparatus for forming a cell sheet, the apparatus comprising:
  a cell-sheet forming member, comprising a surface for forming the cell sheet, wherein:
    the surface includes a plurality of flat portions and a plurality of recession/protrusion portions;
    each of the plurality of flat portions has a shape extending in a first direction, and the plurality of flat portions are arrayed in a second direction intersecting the first direction over an entirety of the surface;
    each of the plurality of recession/protrusion portions includes a plurality of protrusions filling a gap between the plurality of flat portions adjacent to each other, a height of the plurality of protrusions is 50 nm or more and 5 μm or less, and a pitch of the plurality of protrusions is between 100 nm and 10 μm inclusive;
    the plurality of protrusions are located on a bottom surface of a recession portion located between the plurality of flat portions adjacent to each other, and wherein the plurality of protrusions are arrayed in a plurality of rows in the first direction and further arrayed in a plurality of rows in the second direction on each recession/protrusion portion;
    in a thickness direction of the cell-sheet forming member, a difference between a height of a distal end surface of each of the plurality of recession/protrusion portions and a height of each of the plurality of flat portions is equal to or less than 0.5 μm;
    each of the plurality of flat portions has a length of 10 μm or more and less than 50 μm in the second direction; and
    each of the plurality of recession/protrusion portions has a length of 10 μm or more and less than 50 μm in the second direction.

2. The apparatus according to claim 1, wherein, in the thickness direction of the cell-sheet forming member, the height of the distal end surface of each of the plurality of recession/protrusion portions is equal to or less than the height of each of the plurality of flat portions.

3. The apparatus according to claim 1, wherein:
each protrusion of the plurality of protrusions has a circular shape as seen in a direction facing the surface;
each protrusion of the plurality of protrusions has a diameter of between 50% and 100% inclusive of the pitch, and
each protrusion of the plurality of protrusions has an aspect ratio of between 0.1 and 10 inclusive.

4. The apparatus according to claim 1, wherein, a cell to be cultured in the cell-sheet forming member is at least one of a myoblast cell, a fibroblast cell, or a myocardium cell.

5. The apparatus according to claim 1, wherein the surface of the cell-sheet forming member has a hydrophilicity or hydrophobicity property.

6. The apparatus according to claim 1, wherein the surface of the cell-sheet forming member includes metal or an organic material.

7. The apparatus according to claim 1, wherein each protrusion of the plurality of protrusions has an aspect ratio of between 0.1 and 10 inclusive.

8. The apparatus according to claim 1, wherein the plurality of protrusions are positioned at one or more apexes of a triangular lattice pattern when viewed in a direction facing the surface.

9. The apparatus according to claim 1, wherein the plurality of protrusions are positioned at an apex of a triangular lattice pattern as seen in a direction facing the surface, and wherein an arrangement of the plurality of protrusions is repeated in the first direction and the second direction within each of the plurality of recession/protrusion portions.

10. The apparatus according to claim 1, wherein the height of the plurality of protrusions is between 50 nm and 1 µm inclusive.

11. The apparatus according to claim 1, wherein each protrusion of the plurality of protrusions has a diameter of between 50% and 100%, inclusive, of the pitch.

12. The apparatus according to claim 1, wherein the pitch of the plurality of protrusions is 300 nm or 600 nm.

13. A method for forming a cell sheet, comprising:
providing the apparatus according to claim 1;
culturing a cell on the surface of the cell-sheet forming member to make the cell to adhere to the surface of the cell-sheet forming member, wherein the cell adheres to one of the plurality of flat portions or one of the plurality of recession/protrusion portions, thereby forming a cell sheet wherein an extension direction of the cell is aligned with the first direction; and
peeling the cell sheet from the surface of the cell-sheet forming member.

14. The method of claim 13, wherein the plurality of protrusions are positioned at one or more apexes of a triangular lattice pattern when viewed in a direction facing the surface.

15. The method of claim 13, wherein, in the thickness direction of the cell-sheet forming member, the height of the distal end surface of each of the plurality of recession/protrusion portions is equal to or less than the height of each of the plurality of flat portions.

16. The method of claim 13, wherein:
each protrusion of the plurality of protrusions has a circular shape as seen in a direction facing the surface;
each protrusion of the plurality of protrusions has a diameter of between 50% and 100% inclusive of the pitch; and
each protrusion of the plurality of protrusions has an aspect ratio of between 0.1 and 10 inclusive.

17. The method of claim 13, wherein a cell to be cultured in the cell-sheet forming member is at least one of a myoblast cell, a fibroblast cell, or a myocardium cell.

18. The method of claim 13, wherein the surface of the cell-sheet forming member has a hydrophilicity or hydrophobicity property.

19. The method of claim 13, wherein the surface of the cell-sheet forming member includes metal or an organic material.

20. The method of claim 13, wherein the plurality of protrusions are positioned at an apex of a triangular lattice pattern as seen in a direction facing the surface, and wherein an arrangement of the plurality of protrusions is repeated in the first direction and the second direction within each of the plurality of recession/protrusion portions.

* * * * *